US006862309B2

(12) United States Patent
DeBrabander et al.

(10) Patent No.: US 6,862,309 B2
(45) Date of Patent: Mar. 1, 2005

(54) PASSIVATION SCHEME FOR OXIDE VERTICAL CAVITY SURFACE-EMITTING LASER

(75) Inventors: Gregory N. DeBrabander, San Jose, CA (US); An-Nien Cheng, San Jose, CA (US); Suning Xie, Santa Clara, CA (US); Wilson Hasan Widjaja, Cupertino, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/361,092

(22) Filed: Feb. 6, 2003

(65) Prior Publication Data

US 2004/0156410 A1 Aug. 12, 2004

(51) Int. Cl.[7] .............................. H01S 3/16; H01S 5/00; H01S 3/20
(52) U.S. Cl. .............................. 372/43; 372/41; 372/49; 372/50; 372/54
(58) Field of Search .............................. 372/43, 41, 45, 372/49, 50, 54, 98, 99, 46, 96; 438/700, 702, 221, 359, 703, 724, 22

(56) References Cited

U.S. PATENT DOCUMENTS

| | | | | |
|---|---|---|---|---|
| 5,563,102 A | * | 10/1996 | Michael | 438/614 |
| 5,719,893 A | * | 2/1998 | Jiang et al. | 372/45 |
| 6,107,188 A | * | 8/2000 | Liu et al. | 438/633 |
| 6,589,805 B2 | * | 7/2003 | Zhu et al. | 438/22 |
| 2003/0108075 A1 | * | 6/2003 | Kim et al. | 372/45 |

OTHER PUBLICATIONS

S. Xie et al., "Reliability of Oxide VCSELs in non–Hermetic Environments", Proceedings of the 15th IEEE Laser and Electro–Optics Society Annual Meeting (LEOS 2002), Glasgow, Scotland, p. 544, paper WW2, Nov. 10–14, 2002.
S. Xie et al., "Reliability and Failure Mechanisms of Oxide VCSELs in non–Hermetic Environments", Proceedings of SPIE vol. 4994, Vertical–Cavity Surface–Emitting Lasers VII, paper 4994–21, San Jose, CA, Jan. 25–31, 2003.
S. Xie et al., "Failure Mode Analysis of Oxide VCSELs in High Humidity and High Temperature", IEEE/OSA Journal of Lighwave Technology, Mar. 2003 (in press).
Suning Xie et al., "Failure Mode Analysis of Oxide VCSELs in High Humidity and High Temperature", Journal of Lightwave Technology, vol. 21, No. 4, Apr. 2003, pp. 1013–1019.

* cited by examiner

*Primary Examiner*—Minsun Oh Harvey
*Assistant Examiner*—Armando Rodriguez

(57) ABSTRACT

A method for forming an oxide VCSEL (vertical cavity surface-emitting laser) includes forming a VCSEL structure, forming an oxidation cavity partially through the VCSEL structure, oxidizing a layer in the VCSEL structure, forming a first passivation layer over a surface of the oxidation cavity, and forming a second passivation layer over the first passivation layer. An oxide VCSEL structure includes a bottom mirror region, an active region atop the bottom mirror region, a top mirror region atop the active region, an oxidation cavity partially through the top mirror region, a first passivation layer covering a surface of the oxidation cavity, and a second passivation layer covering the first passivation layer. In both the method and the structure, the first passivation layer can be made of silicon nitride (SiN) while the second passivation layer can be made of silicon oxynitride (SiON).

9 Claims, 2 Drawing Sheets

PASSIVATION SCHEME FOR OXIDE VERTICAL CAVITY SURFACE-EMITTING LASER

FIELD OF INVENTION

This invention relates to oxide vertical cavity surface-emitting lasers (VCSELs).

DESCRIPTION OF RELATED ART

Oxide VCSELs are fabricated by oxidizing a layer in the epitaxial stack through cavities etched in the wafer face to define a lasing area. This process leaves an entry path for moisture that causes oxide VCSEL failure in operation. For example, see S. Xie, G. De Brabander, W. Widjaja, U. Koelle, A. N. Cheng, L. Giovane, F. Hu, R. Herrick, M. Keever, and T. Osentowski, "Reliability of Oxide VCSELs in non-Hermetic Environments", Proceedings of the 15th IEEE Laser and Electro-Optics Society Annual Meeting (LEOS 2002), Glasgow, Scotland, p. 544, paper WW2, Nov. 10–14, 2002; S. Xie, R. Herrick, G. De Brabander, W. Widjaja, U. Koelle, A. N. Cheng, L. Giovane, F. Hu, R. Herrick, M. Keever, T. Osentowski, S. McHugo, M. Mayonte, S. Kim, D. Chamberlin, S. J. Rosner, and G. Girolami, "Reliability and Failure Mechanisms of Oxide VCSELs in non-Hermetic Environments", Proceedings of SPIE Vol. 4994, Vertical-Cavity Surface-Emitting Lasers VII, paper 4994-21, San Jose, Calif., Jan. 25–31, 2003; S. Xie, R. Herrick, D. Chamberlin, S. J. Rosner, S. McHugo, G. Girolami, M. Mayonte, S. Kim, and W. Widjaja, "Failure Mode Analysis of Oxide VCSELs in High Humidity and High Temperature", IEEE/OSA Journal of Lighwave Technology, March 2003 (in press).

Thus, oxide VCSELs need to be either packaged in hermetic cans, which is an expensive and cumbersome option for multi-channel arrays, or passivated to prevent moisture from getting into the oxide layer. What are needed are a method and an apparatus that prevent moisture from entering the oxide VCSELs.

SUMMARY

In accordance with one aspect of the invention, a method for forming an oxide VCSEL includes forming a VCSEL structure, forming an oxidation cavity partially through the VCSEL structure, oxidizing a layer in the VCSEL structure, forming a first passivation layer over a surface of the oxidation cavity, and forming a second passivation layer over the first passivation layer. In one embodiment, the first passivation layer is made of silicon nitride (SiN) while the second passivation layer is made of silicon oxynitride (SiON).

In accordance with another aspect of the invention, an oxide VCSEL structure includes a bottom mirror region, an active region atop the bottom mirror region, a top mirror region atop the active region, an oxidation cavity partially through the top mirror region, a first passivation layer covering a surface of the oxidation cavity, and a second passivation layer covering the first passivation layer. In one embodiment, the first passivation layer is made of SiN while the second passivation layer is made of SiON.

DETAILED DESCRIPTION

Figure 1:
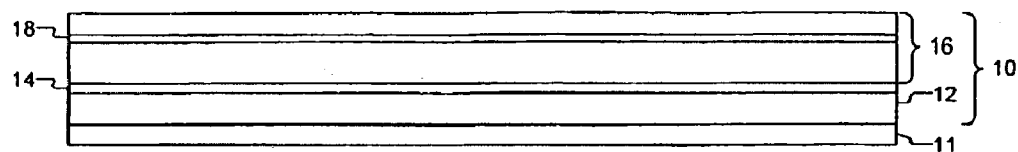
FIGS. 1, 2, 3, 4, 5, and 6 illustrate the process of forming an oxide VCSEL in one embodiment of the invention.

FIG. 1 illustrates a starting material that includes a VCSEL structure 10 formed on a wafer 11 (shown only in FIG. 1). Typically, a gallium arsenide wafer 11 is used. VCSEL structure 10 is formed by growing a bottom mirror region 12 atop wafer 11, an active region 14 atop of region 12, and a top mirror region 16 atop of region 14. Since the construction of VCSELs is well known, the exact structure and process are not described in detail.

Typically, bottom mirror region 12 is an n-doped DBR (distributed Bragg reflector) mirror structure constructed from alternating layers having different refractive indices. The alternating layers can be made of aluminum gallium arsenide (AlGaAs) at two different aluminum mole fractions (e.g., 90% and 15%).

Typically, top mirror region 16 is a p-doped DBR mirror structure constructed from alternating layers having different refractive indices. Like region 12, the alternating layers can be made of AlGaAs at two different aluminum mole fractions (e.g., 90% and 15%). After growing one or more pairs of the alternating layers in region 16, an oxidation layer 18 (shown only in FIGS. 1, 2, and 3) is grown. Oxidation layer 18 is made of AlGaAs at the highest aluminum mole fraction (e.g., 95%) in structure 10. Then, the rest of the alternating layers in region 16 are grown.

Figure 2:
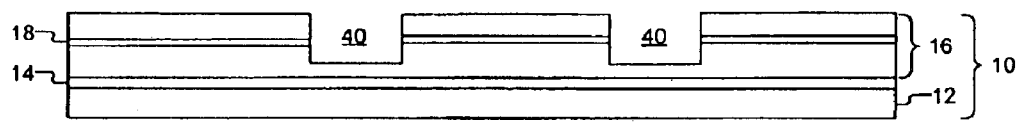
Figure 3:
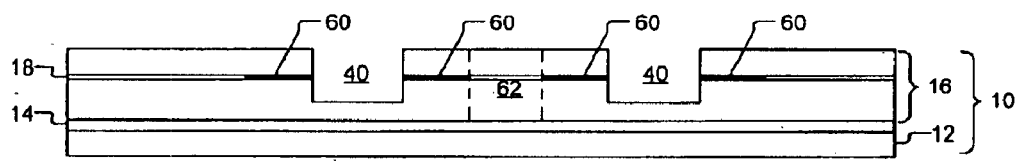

Structure 10 is then etched to form one or more oxidation cavities 40 (FIG. 2). Oxidation cavities 40 extend into top mirror region 16 pass oxidation layer 18. Oxidation cavities 40 are formed around a lasing area of the resulting VCSEL. A nitride mask layer can be used to define where oxidation cavities 40 are etched. Oxidation cavities 40 can be formed by either wet or dry etch.

Structure 10 is next placed in an oxidation oven. The nitride mask layer used for etching oxidation cavities 40 can remain as an oxidation mask to prevent the oxidation of the top surface of structure 10. Steam is introduced through oxidation cavities 40 to oxidation layer 18, which laterally oxidizes. The oxidized regions of oxidation layer 18 form insulation regions 60 (FIG. 3) that limit current flow and establish optical confinement within an aperture or lasing volume 62 (shown only in FIG. 3) of the resulting VCSEL.

Figure 4:
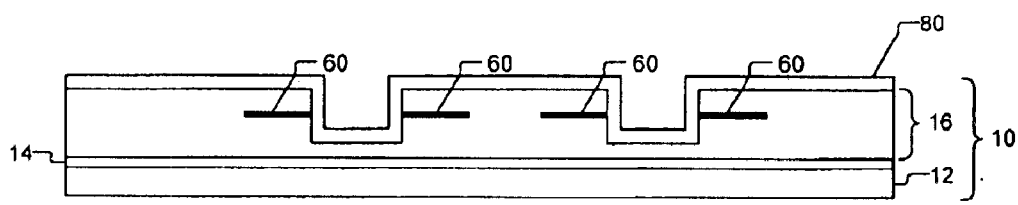

Structure 10 is then coated with a first passivation layer 80 (FIG. 4). Notably, passivation layer 80 covers the surface of oxidation cavities 40. Passivation layer 80 is made of silicon nitride (SiN) and has a thickness of approximately 0.5 micron. Passivation layer 80 can be formed by plasma-enhanced chemical vapor deposition (PECVD) at a temperature T1.

Figure 5:
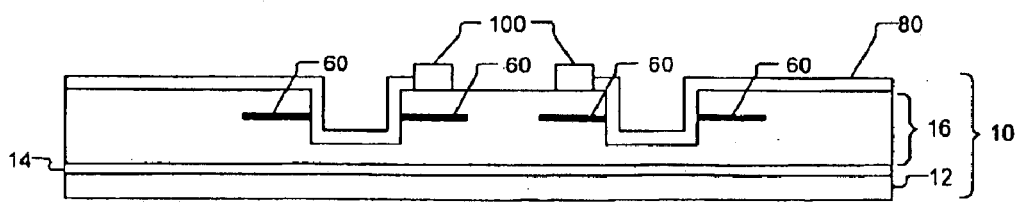

Metal contact 100 (FIG. 5) is next formed where a current is to be supplied to the resulting VCSEL. Metal contact 100 is formed by etching away passivation layer 80 over the laser area and patterning a metal layer.

Figure 6:
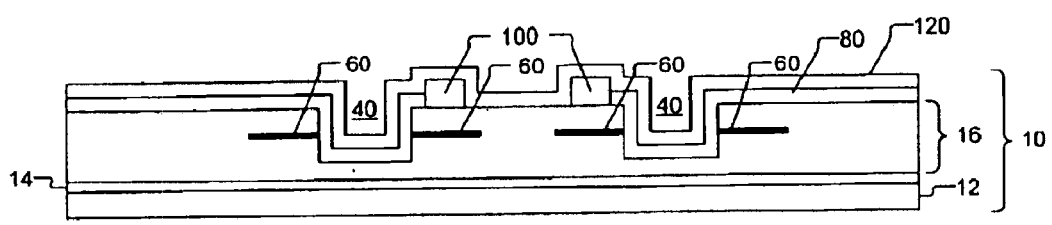

Structure 10 is then coated with a second passivation layer 120 (FIG. 6). Notably, passivation layer 120 covers the surface of oxidation cavities 40 and aperture 62. Passivation layer 120 is made of silicon oxynitride (SiON). Passivation layer 120 has an optical thickness of approximately ½ of the laser light wavelength so it does not affect the light emission of the resulting VCSEL. Passivation layer 120 can be formed by PECVD at a temperature T2 lower than temperature T1.

Figure 7:
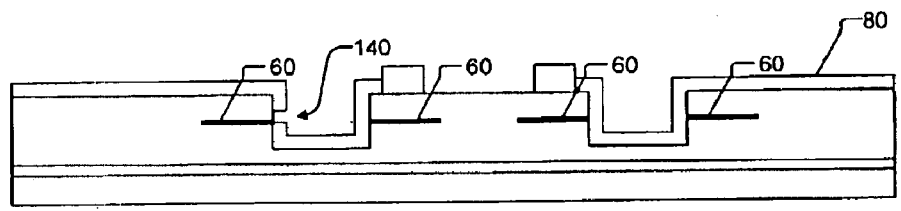
FIGS. 7 and 8 illustrate the benefits of the oxide VCSEL formed in the process of FIGS. 1 to 6 in one embodiment of the invention.

Passivation layer 80 is a film with good adhesion to GaAs, a high stress level, and a moderate level of pinholes. The high stress level only allows a thin passivation layer 80 to be deposited so VCSEL structure 10 does not crack. As shown in FIG. 7, it is believed that the thin passivation layer 80 is more susceptible to pinholes, such as pinhole 140, that allow moisture to enter insulating regions 60. From experimental results, it is know that VCSELs coated with only passivation layer 80 will experience an unacceptably high random failure rate when tested under an environment of 85° C. and 85% humidity for 1000 hours.

Figure 8:
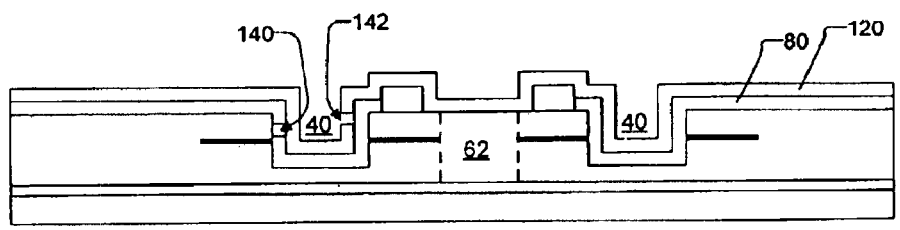

Passivation layer 120 has a low stress level and is deposited atop passivation layer 80 at a lower temperature. The lower stress level allows VCSEL structure 10 to withstand a thick layer of passivation layer 120 without cracking, thereby reducing the number of pinholes. The lower deposition temperature assures that pinholes created in passivation layer 80 by residue outgassing will be covered, since the residue source will have burned off during the deposition of passivation layer 80 at a higher deposition temperature. As shown in FIG. 8, it is believed that passivation layer 120 covers the pinholes in passivation layer 80, such as pinhole 140. Conversely, the pinholes in passivation layer 120, such as pinhole 142, are covered by passivation layer 80. Furthermore, passivation layer 120 also protects the top surface of aperture 62 from the environment.

Various other adaptations and combinations of features of the embodiments disclosed are within the scope of the invention. For example, instead of a second SiON passivation layer, a second SiN passivation layer deposited at a lower temperature can be used. Although only one VCSEL structure is shown in the figures, one skilled in the art understands that the process described can be used to construct an array of VCSELs. Numerous embodiments are encompassed by the following claims.

What is claimed is:

1. A method for forming an oxide vertical cavity surface-emitting laser (VCSEL), comprising:

forming a VCSEL structure;

forming an oxidation cavity partially through the VCSEL structure;

oxidizing a layer in the VCSEL structure to define a lasing aperture;

depositing a first passivation layer over the oxidation cavity and the laser aperture;

etching away the first passivation layer over the laser aperture;

forming a metal contact about the laser aperture; and forming a second passivation layer over the first passivation layer and the laser aperture of the VCSEL.

2. The method of claim 1, wherein said forming a first passivation layer comprises depositing SiN over the surface of the oxidation cavity.

3. The method of claim 2, wherein said forming a second passivation layer comprises depositing SiON over the first passivation layer.

4. The method of claim 3, wherein said forming a second passivation layer occurs at a lower temperature than said forming a first passivation layer.

5. The method of claim 1, wherein said forming a VCSEL structure comprises:

forming a bottom mirror region atop a wafer;

forming an active region atop the bottom mirror region; and forming a top mirror region atop the active region.

6. An oxide vertical cavity surface-emitting laser (VCSEL), comprising:

a bottom mirror region;

an active region atop the bottom mirror region;

a top mirror region atop the active region;

an oxidation cavity partially through the top mirror region;

a first passivation layer covering a surface of the oxidation cavity;

a metal contact about a laser aperture; and a second passivation layer covering the first passivation layer and the laser aperture of the VCSEL.

7. The VCSEL of claim 6, wherein the first passivation layer comprises SiN.

8. The VCSEL of claim 6, wherein the second passivation layer comprises SiON.

9. A method for forming an oxide vertical cavity surface-emitting laser (VCSEL), comprising:

forming a VCSEL structure;

forming an oxidation cavity partially through the VCSEL structure;

oxidizing a layer in the VCSEL structure;

forming a first passivation layer over a surface of the oxidation cavity; and forming a second passivation layer over the first passivation layer, wherein said forming a second passivation layer occurs at a lower temperature than said forming a first passivation layer.

* * * * *